United States Patent
Maki

(10) Patent No.: US 6,689,984 B2
(45) Date of Patent: Feb. 10, 2004

(54) SUSCEPTOR WITH BUILT-IN ELECTRODE AND MANUFACTURING METHOD THEREFOR

(75) Inventor: Keigo Maki, Narashino (JP)

(73) Assignee: Sumitomo Osaka Cement Co., Ltd. (JP)

(*) Notice: Subject to any disclaimer, the term of this patent is extended or adjusted under 35 U.S.C. 154(b) by 0 days.

(21) Appl. No.: 10/285,791

(22) Filed: Oct. 31, 2002

(65) Prior Publication Data

US 2003/0089687 A1 May 15, 2003

(30) Foreign Application Priority Data

Nov. 13, 2001 (JP) ......................................... 2001-347793

(51) Int. Cl.⁷ .............................................. B23K 10/00
(52) U.S. Cl. ............................. 219/121.43; 219/121.52; 219/121.58; 219/444.1; 156/345.52; 118/725
(58) Field of Search ..................... 219/121.43, 121.41, 219/121.4, 121.58, 444.1, 121.52; 118/724, 725; 156/345.35, 345.47, 345.52; 204/298.21, 298.36, 298.38

(56) References Cited

U.S. PATENT DOCUMENTS

| | | | | |
|---|---|---|---|---|
| 4,619,865 A | * | 10/1986 | Keem et al. | ................. 428/333 |
| 5,683,606 A | * | 11/1997 | Ushikoshi et al. | ........... 219/544 |
| 6,475,606 B2 | * | 11/2002 | Niwa | .......................... 428/210 |
| 6,507,006 B1 | * | 1/2003 | Hiramatsu et al. | ........ 219/444.1 |

FOREIGN PATENT DOCUMENTS

| | | |
|---|---|---|
| JP | 04-300136 | 10/1992 |
| JP | 06-151044 | 5/1994 |
| JP | 2001-287982 | 10/2001 |
| JP | 2001-308165 | 11/2001 |

* cited by examiner

Primary Examiner—Mark Paschall
(74) Attorney, Agent, or Firm—Ostrolenk, Faber, Gerb & Soffen, LLP

(57) ABSTRACT

There is provided a susceptor with a built-in electrode that has excellent corrosion resistance and plasma resistance, and that has excellent durability to the stress of heat cycles, and a manufacturing method for a susceptor with a built-in electrode that enables the susceptor to be manufactured economically. The susceptor with a built-in electrode comprises: a susceptor substrate formed from an aluminum oxide based sintered body; an internal electrode built into the susceptor substrate; and a power supply terminal that is provided so as to make contact with this internal electrode, wherein the internal electrode is formed from an aluminum oxide and molybdenum carbide based composite sintered body containing 30 to 95 volume % of molybdenum carbide and 5 to 75 volume % of aluminum oxide.

12 Claims, 3 Drawing Sheets

SUSCEPTOR WITH BUILT-IN ELECTRODE AND MANUFACTURING METHOD THEREFOR

BACKGROUND OF THE INVENTION

1. Field of the Invention

The present invention relates to a susceptor with a built-in electrode and a manufacturing method therefor. In particular, the invention relates to a susceptor with a built-in electrode that has excellent corrosion resistance and plasma resistance and has an excellent durability to repeated rising and falling of the temperature, that is, the stress due to heat cycles, and a manufacturing method for a susceptor with a built-in electrode that enables the susceptor to be manufactured economically.

2. Description of the Related Art

In recent years, a manufacturing process called a "single plate processing" that is, a manufacturing process plate by plate, is attracting attention in the field of manufacturing semiconductor devices such as ICs, LSIs and VLSIs because only the single plate processing ensures the reliable and uniform film deposition and etching in deposition systems such as a plasma etching apparatus, plasma CVD apparatus on plate specimens such as semiconductor wafers, glass plates as liquid crystal substrate, printing boards or the like. In this plate by plate processing, in order to process plate substrates one by one in a processing room, the plate specimens are mounted on a specimen support (pedestal) called a susceptor, and predetermined processing is carried out.

Because the susceptor must withstand for use within plasma atmosphere and for use in high temperature atmosphere, the susceptor must have excellent durability against exposure of plasma (plasma resistance) and high heat conductivity. For such a susceptor, a susceptor formed by an aluminum oxide sintered body exhibits excellent plasma resistance, thermal conductivity and heat resistance.

A particular type of susceptor is provided which comprises an internal electrode for use as a plasma generating electrode for generating plasma by supplying high-frequency electric power, as an electrostatic chucking electrode for chucking a plate specimen by an electrostatic attractive force originated by generated electric charge, or as a heater electrode for heating a plate specimen by resistive heating.

Conventionally, a structure shown in FIG. 3 is known as an example of a susceptor with a built-in electrode, formed by aluminum oxide based sintered body.

As shown in FIG. 3, a susceptor with a built-in electrode 5 (a susceptor with an internal electrode 2, which serves as a plasma generation electrode, is shown as an example) comprises: a mounting plate 1 for mounting a plate specimen; a support plate for supporting the mounting plate 1; an internal electrode 2 formed between the mounting plate 1 and the support plate 3; and a power supply terminal 4, which is embedded in the support plate 3 so as to be in contact with the internal electrode 2, and which supplies current to the internal electrode 2.

The mounting plate 1 is a flat body formed by a nonconductive aluminum oxide based sintered body, the support plate 3 is a flat substrate formed by a nonconductive aluminum oxide based sintered body, and the internal electrode 2 is constituted containing high melting point metals such as tungsten, molybdenum, tantalum, niobium or the like.

However, such a susceptor with a built-in electrode using an aluminum oxide based sintered body cannot withstand the stress of heat cycles (for example, repeated cycles of rising and falling temperature when the internal electrode 2 is used as a heater electrode, or the abnormal heating by the internal electrode when the internal electrode 2 is used as a plasma generation electrode), due to thermal stress caused by the difference in thermal expansion coefficients between the aluminum oxide based sintered body and the high melting point metal such as tungsten, molybdenum, tantalum, niobium or the like. Therefore, the problem arises in that conventional susceptor is cracked easily, durability is not sufficient, and cost is also high.

SUMMARY OF THE INVENTION

In order to solve the aforementioned problems, an object of the present invention is to provide a susceptor with a built-in electrode, which has not only excellent corrosion resistance, heat resistance and plasma resistance, but also has excellent durability for the aforementioned heat cycle stress, and to also provide a manufacturing method for a susceptor with a built-in electrode that allows producing such a susceptor with a built-in electrode at reduced cost.

As a result of intensive research into solving the above problems, the inventors discovered that by forming an internal electrode using a conductive material having a special composition inside the susceptor substrate made of an aluminum oxide based sintered body (in the present specification, "aluminum oxide based sintered body" refers to not only an aluminum oxide sintered body, but also general aluminum oxide sintered body that contains aluminum oxide and other components such as silicon carbide, silica or the like at a ratio of less than 50 wt %, preferably less than 20 wt %), the above problems can be solved effectively and the present invention has been attained.

A susceptor with a built-in electrode according to a first aspect of the present invention comprises; a susceptor substrate made of an aluminum oxide based sintered body, an internal electrode, that is sealed in the susceptor substrate, and a power supply terminal that is embedded in the substrate in a state contacting with the internal electrode, wherein the internal electrode is formed by an aluminum oxide and molybdenum carbide based composite sintered body containing 30 to 95 volume % of molybdenum carbide and 5 to 70 volume % of aluminum oxide.

According to the second aspect of the present invention, in the above susceptor with a built-in electrode, said susceptor substrate comprises a first substrate formed by an aluminum oxide based sintered body and a second substrate formed by an aluminum oxide based sintered body, which is joined and unified with said first substrate.

According to the third aspect of the present invention, in the above susceptor with a built-in electrode, in the above susceptor with a built-in electrode, an insulating material layer comprising insulating material that has the same composition or the same principal component as the material constituting said first substrate and said second substrate is formed in a region excluding a part where said internal electrode is formed, so as to seal the internal electrode between the first substrate and the second electrode.

According to the fourth aspect of the present invention, in the above susceptor with a built-in electrode, said power supply terminal is formed by any one of an aluminum oxide and molybdenum carbide based composite sintered body, an aluminum oxide and tantalum carbide based composite sintered body, an aluminum oxide and tungsten based composite sintered body, and an aluminum oxide and silicon carbide based composite sintered body.

In the susceptor with a built-in electrode with the construction described in the first to fourth aspects, since the internal electrode is formed by composite sintered body based on the aluminum oxide, and since the thermal stress caused by the difference between the coefficients of thermal expansion of the aluminum oxide based sintered body and the internal electrode is reduced, no cracking due to repeated rising and falling of the temperature (in other words, due to the heat cycles stress) occurs, the thermal durability of the susceptor is improved significantly. Furthermore, in contrast to the conventional susceptor in which the first substrate and the second substrate is not sealed using the insulating layer, since the susceptor with the built-in electrode according to the present invention is formed by sealing the internal electrode between the first and second substrates by use of the insulating layer, no corrosive gas or plasma penetrates the interface between the first plate and the second plate, and the internal electrode is not likely to be exposed to the corrosive gas or plasma, the susceptor exhibits excellent corrosion resistance and plasma resistance.

A manufacturing method for a susceptor with a built-in electrode according to a fifth aspect of the present invention comprises the steps of: forming a hole in a second substrate formed by an aluminum oxide based sintered body so as to pass through the substrate; fixing a power supply terminal into this hole; then coating the second substrate holding the power supply terminal, with a coating material containing an aluminum oxide and molybdenum carbide based composite material (in the present specification, "aluminum oxide with molybdenum carbide based composite material" also refers to a mixture of aluminum oxide and molybdenum carbide) containing 30 to 95 volume % of molybdenum carbide and 5 to 70 volume % of aluminum oxide, so as to make contact with the power supply terminal; drying; superposing the second substrate onto a first substrate formed from an aluminum oxide based sintered body so as to enclose the surface coated with the coating material; and heat treating under pressure, to thereby join and unify them, and also to form an internal electrode comprising an aluminum oxide and molybdenum carbide based composite sintered body between the first substrate and the second substrate.

In a manufacturing method for a susceptor with a built-in electrode with such a construction, since the already sintered mounting plate and the support plate can be heat treated together and joined and unified, it is easily possible to obtain a susceptor with a built-in internal electrode that has excellent corrosion resistance and plasma resistance, that withstands the stress of heat cycles, and that has excellent durability without causing cracks. Furthermore, since expensive niobium or tantalum are not needed to use, it is possible to manufacture a susceptor with a built-in internal electrode at reduced cost and at high production yield.

Moreover, a manufacturing method for a susceptor with a built-in electrode according to a sixth aspect of the present invention comprises the steps of: forming a first green body and a second green body that serve after sintering as a first substrate and a second substrate respectively; forming a hole in this second green body; fixing a power supply terminal into this hole so as to pass through the second green body; then coating the green body holding the power supply terminal, with a coating material containing an aluminum oxide and molybdenum carbide based composite material containing 30 to 95 volume % of molybdenum carbide and 5 to 70 volume % of aluminum oxide, so as to make contact with the power supply terminal, and drying it; then superposing the second green body onto the first green body so as to enclose the surface coated with the coating material; and heat treating under pressure and sintering, thereby forming a first substrate and a second substrate, which are joined and unified, and also forming an internal electrode comprising an aluminum oxide and molybdenum carbide based composite sintered body between the first and second substrates.

In a manufacturing method for a susceptor with a built-in electrode with such a construction, since the first and the second green bodies can be joined and unified, and also heat treated, it is easily possible by one heat treatment to obtain a susceptor with a built-in internal electrode that has excellent corrosion resistance and plasma resistance, that withstands the stress of heat cycles, and that has excellent durability without causing cracks. Furthermore, since expensive niobium or tantalum are not needed to use, it is possible to manufacture a susceptor with a built-in internal electrode at reduced cost and at high production yield.

DETAILED DESCRIPTION OF THE INVENTION

The present invention will be described in detail with embodiments of the invention. Here, the embodiments do not limit the scope of the invention unless specified.

Susceptor with a Built-in Electrode

Figure 1:
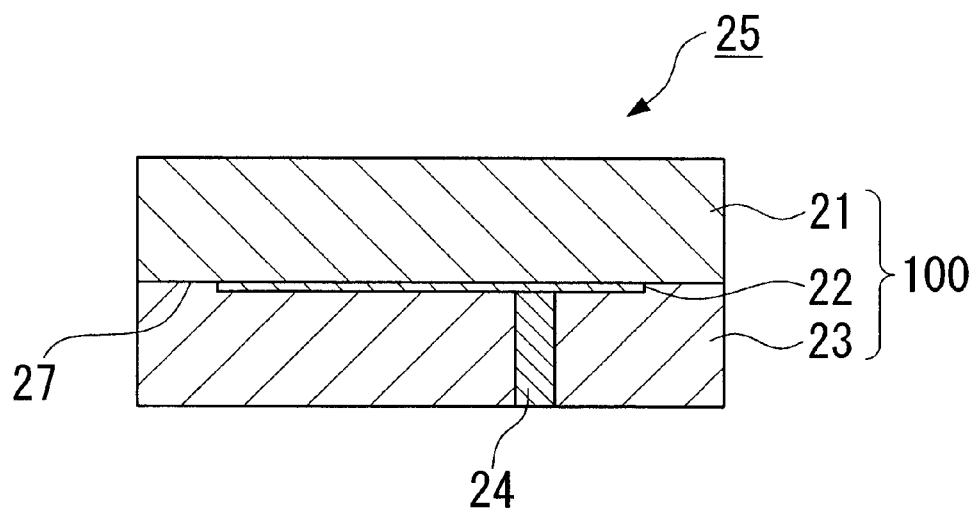
FIG. 1 is a cross-sectional diagram showing a susceptor with a built-in electrode of a first embodiment of the present invention.

FIG. 1 shows an embodiment of a susceptor with a built-in electrode of the present invention. The susceptor with a built-in electrode 25 in FIG. 1 is a susceptor with a built-in electrode in the case where an internal electrode 22 is a plasma generation electrode, and comprises: a first substrate 21, being a mounting plate (polished such that the flatness of the plate specimen mounting surface is 10 μm or less) on which a plate specimen is mounted; a second substrate 23 serving as a supporting body, which is unified with the first substrate 21; an internal electrode 22 formed between the first substrate 21 and the second substrate 23; and a power supply terminal 24 connected to this internal electrode 22, and provided so as to pass through the inside of the second substrate 23.

The first substrate 21 and the second substrate 23 constitute a susceptor substrate 100, and are joined and unified by an insulating material layer 27 made of an insulating material, which is made of the same composition or whose principal component is the same insulating material.

The first substrate 21 and the second substrate 23 have the same superposition surfaces, and both substrates 21 and 23 are made of an aluminum oxide based sintered body.

The insulating layer 27 is provided in order to seal the interface region of the first substrate 21 and the second substrate 22, in other words, the outer peripheral region excluding the region in which the internal electrode 22 is formed, and the insulating layer 27 comprises the insulating material that has the same composition or the same principal component as the material constituting the first substrate 21 and the second substrate 23. Here, "a material that has the same principal component" refers to a material that contains 50 wt % or less, and preferably 20 wt % or less, of material other than the aluminum oxide constituting the first substrate 21 and the second substrate 23, for example silicon carbide, silica, or the like.

The internal electrode 22 is used as; a plasma generation electrode for performing plasma processing by conducting high-frequency power and generating plasma, an electrostatic chuck electrode for generating an electric charge to secure the plate specimen by electrostatic attraction, a heater electrode for heating the plate specimen by resistive heating, and the like, and the shape and size thereof are adjusted appropriately according to its use.

This internal electrode 22 is formed from an aluminum oxide and molybdenum carbide based composite sintered body containing 30 to 95 volume % of molybdenum carbide, and 5 to 70 volume % of aluminum oxide. Since this, aluminum oxide and molybdenum carbide based composite sintered body has a low volume resistance value (approximately $10^{-4}$ $\Omega \cdot cm$), then even if a high power is supplied to the internal electrode 22, the internal electrode 22 does not generate abnormal heat, thus enabling a high power to be input to the internal electrode 22. Furthermore, when the internal electrode 22 is used as a plasma generation electrode, it is possible to generate a high density plasma.

In the internal electrode, if the content of molybdenum carbide is less than 30 volume %, then sufficient conductivity cannot be obtained. On the other hand, if the content of molybdenum carbide in the internal electrode exceeds 95 volume %, a diffusion reaction with the aluminum oxide based sintered body results in degrading the structural strength of the susceptor substrate, and the susceptor substrate and the internal electrode become detached. Therefore the first substrate and the second substrate, which constitute the susceptor substrate, cannot be joined and unified satisfactorily. Furthermore, thermal stress caused by the difference from the coefficient of thermal expansion of the aluminum oxide based sintered body cannot be reduced sufficiently, so durability of the susceptor with a built-in electrode is reduced.

The power supply terminal 24 is provided in order to supply an electric current to the internal electrode 22, and the number, shape and size thereof is determined based on the shape of the internal electrode 22.

This power supply terminal 24 is formed from a conductive composite sintered body formed by pressure sintering, for example an aluminum oxide and molybdenum carbide based composite ceramic powder, an aluminum oxide and tantalum carbide based composite ceramic powder, an aluminum oxide and tungsten based composite ceramic powder, an aluminum oxide and silicon carbide based composite ceramic powder or the like. If the power supply terminal 24 is formed from a composite conductive sintered body of any one of these, the susceptor with a built-in electrode has excellent durability to repeated rising and falling temperature, in other words, heat cycle stress.

Manufacturing Method for Susceptor with a Built-in Electrode

Hereunder is a detailed description of a manufacturing method for the susceptor with a built-in electrode 25 as above.

Figure 2A:
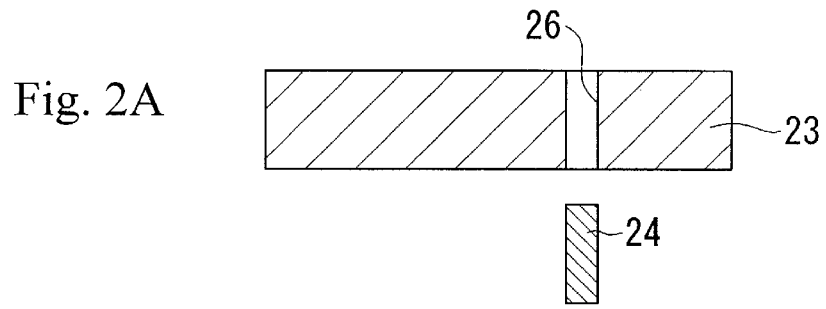
FIGS. 2A, 2B, and 2C are process diagrams showing a manufacturing method for the susceptor with a built-in electrode according to the first embodiment of the present invention.
Figure 2A:
Figure 2B:
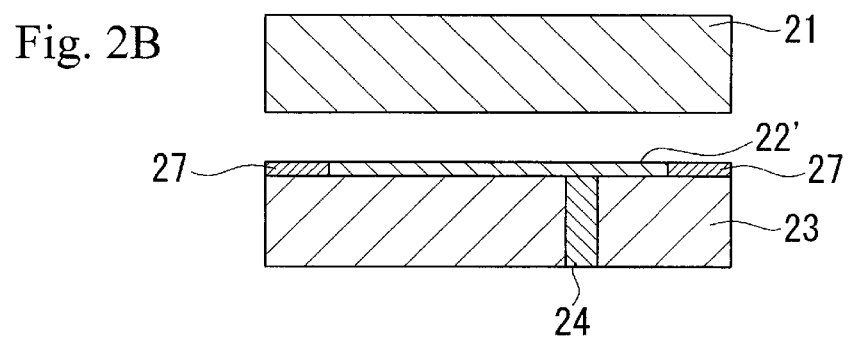
Figure 2B:
Figure 2C:
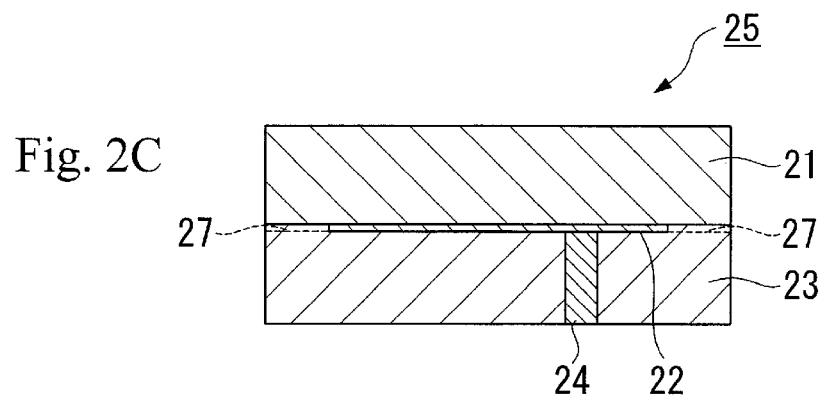
Figure 3:
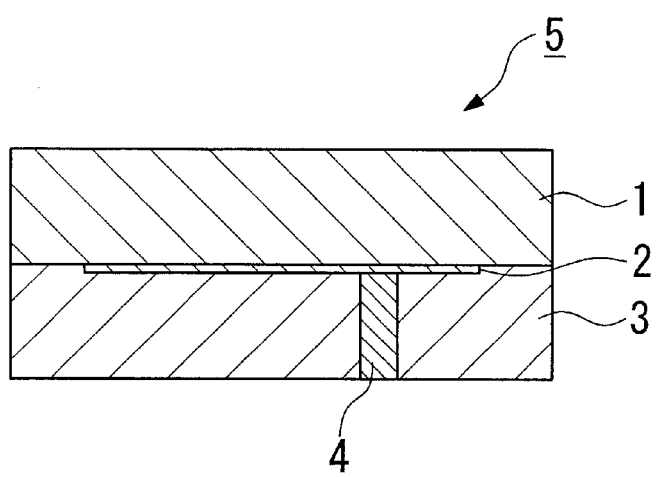
FIG. 3 is a cross-sectional diagram showing an example of a conventional susceptor with a built-in electrode.

FIGS. 2A, 2B, and 2C show diagrams representing the manufacturing process for the susceptor with a built-in electrode 25 in the case where the internal electrode 22 is a plasma generation electrode.

First, a flat first substrate 21 and second substrate 23 formed by aluminum oxide based sintered bodies are manufactured. Next, a hole 26 for receiving and holding the power supply terminal 24 is formed in the first substrate 23. There is no particular limitation on the method used to form this hole 26, and it can be formed using, for example, drilling using a diamond drill, laser processing, electrical discharge machining, or ultrasonic machining. Moreover, the accuracy of this processing may be normal machining accuracy, and the processing can be performed with a yield approaching 100%.

The location of the hole 26 is determined according to the form and shape of the internal electrode 22.

Next, the power supply terminal 24 is manufactured to such a size and shape that can fit tightly within the hole 26.

As an example of a manufacturing method for the power supply terminal 24, in the case where the power supply terminal 24 is made from a conductive composite sintered body, there is a method in which conductive ceramic powder is formed into a desired shape, and then undergoes pressure sintering. At this time, the conductive ceramic powder used in the power supply terminal 24 is preferably the same as that used in the internal electrode 22 formed inside the susceptor 25. Furthermore, in the case where the power supply terminal 24 is made from a metal, it can be formed from a high melting point metal using a known metal processing method such as grinding or powder metallurgy.

Since this power supply terminal 24 is resintered and set in a subsequent pressurized heat treatment, the processing accuracy thereof may have a clearance within the standard Japan Industrial Standard (JIS) tolerance level.

Next, the manufactured power supply terminal 24 is fitted into the hole 26 in the second substrate 23.

Then, a plasma generation electrode forming coating material formed from a coating material comprising an aluminum oxide and a molybdenum carbide based composite material containing 30 to 95 volume % of molybdenum carbide, and 5 to 70 volume % of aluminum oxide dispersed in an organic solvent such as terpineol, is coated onto a predetermined region on the surface of the second substrate 23 where the power supply terminal 24 is fitted so as to make contact with the power supply terminal 24, and then dried, thereby forming an internal electrode forming layer 22'. For a coating method of such coating material where a uniform coating is required having an even thickness, it is desirable to use screen printing or the like.

Furthermore, in those regions on the support plate 23 other than the region where the internal electrode forming layer 22' is formed, an insulating material layer 27 containing a powdered material that has the same composition as, or which shares a principal component with the material that constitutes the first substrate 21 and the second substrate 23, is formed in order to improve insulation, corrosion resistance and plasma resistance.

This insulating material layer 27 can be formed, for example, by coating a coating material consisting of aluminum oxide powder dispersed in an organic solvent such as terpineol at a predetermined locations by screen printing or the like, and drying.

Next, after superposing the first substrate 21 onto the second substrate 23 upon which the internal electrode forming layer 22' and the insulating material layer 27 are formed, via the internal electrode forming layer 22' and the insulating material layer 27, the resulting product is heat treated under pressure. For the heat treatment conditions at this time, it is preferable that the atmosphere is a vacuum or an inert gas atmosphere of Ar, He, $N_2$ or the like. It is desirable that the pressure applied is 5 MPa to 40 Mpa, and that the heat treatment temperature is between 1500° C. and 1850° C.

Thus, the internal electrode forming layer 22' formed on the second substrate 23 is sintered, thereby obtaining an internal electrode 22 formed from a composite conductive sintered body. Furthermore, the first substrate 21 and the second substrate 23 are joined and unified via the insulating material layer 27 by heat treatment under pressure only, without providing an organic or metal binder between the second substrate 23 and the first substrate 21. Moreover, the power supply terminal 24 is resintered by heat treatment under pressure and fixed into the hole 26 in the second substrate 23.

In a susceptor with a built-in electrode obtained by the above-described manufacturing method for a susceptor with a built-in electrode, thermal stress caused by the difference of coefficients of thermal expansion between the aluminum oxide based sintered body and the internal electrode is reduced, the repeated rising and falling temperature, in other words heat cycles stress, is withstood, and no cracking occurs, thus improving durability significantly. Furthermore, an insulating layer 27 formed from an insulating material that is of the same composition as, or has the same principal component as the material constituting the first substrate 21 and the second substrate 23 is formed on their joining surfaces, and the first substrate 21 and the second substrate 23 are joined and unified by this insulating layer 27. Therefore there is no concern about gas or plasma or the like penetrating the inside of the susceptor with a built-in internal electrode 25 from the interface of the first substrate 21 and the second substrate 23, and the internal electrode 22 is thus not exposed to these. Consequently, there is no concern about the interface of the first substrate 21 and the second substrate 23 being damaged. Moreover, since for the built-in internal electrode 22 there is no occurrence of abnormal electrical discharge or damage or the like, the corrosion resistance and plasma resistance of the susceptor with a built-in electrode 25 can be improved.

In such a manufacturing method for a susceptor with a built-in electrode 25, it is not necessary to use expensive niobium, tantalum or the like, thus enabling a susceptor with a built-in electrode 25 to be manufactured economically and with a high yield. Furthermore, since the first substrate 21 and the second substrate 23 are adequately joined and unified by the insulating material layer 27, special design is not required for their shapes, thus enabling a simple flat shape.

In the manufacturing method for a susceptor with a built-in electrode described above, a method is described where the first substrate 21 and the second substrate 23 formed from an aluminum oxide based sintered body are used, and joined and unified by heat treatment under pressure. However, any method in which the first substrate 21 and the second substrate 23 are joined and unified by heat treatment under pressure via the internal electrode 22 is possible, and there is no particular limitation to the above-described method.

For an example of a manufacturing method other than the above, there is a method for obtaining a susceptor with a built-in electrode wherein flat green bodies, which form the first substrate and the second substrate after calcinating, are manufactured from a slurry containing an aluminum oxide based powder, and these green bodies are superposed via the internal electrode forming layer, then sintered, and joined and unified at the same time as sintering.

In this manufacturing method, a product that is already sintered may be used for the power supply terminal, or a green body that forms a power supply terminal after sintering may be used. The other manufacturing conditions are the same as in the former manufacturing method using an already sintered body.

EXAMPLES

The present invention is described in detail through examples and comparative examples in a case where the internal electrode is a plasma generation electrode.

Example 1

Manufacturing the Power Supply Terminal 50 parts by volume of alumina oxide powder (average particle diameter 0.2 μm), 50 parts by volume of tantalum carbide powder (average particle diameter 0.2 μm), and 100 parts by volume of isopropyl alcohol were mixed together and then evenly dispersed using a planetary ball mill, thereby obtaining a slurry.

The alcohol portion of this slurry was removed by suction filtration, the remaining solid portion was dried, and an alumina oxide and tantalum carbide composite powder was obtained.

Next, the aforementioned composite powder was molded and sintered, thereby obtaining a cylinder shaped alumina oxide and tantalum carbide composite conductive sintered body with a diameter of 5 mm and a length of 5 mm to serve as a power supply terminal 16. The sintering was pressurized sintering using a hot press, with the conditions being a temperature of 1800° C. and a pressure of 10 MPa. The relative density of the alumina oxide and tantalum carbide composite conductive sintered body after sintering was 98% or higher.

Manufacturing the Support Plate

A mixed powder of 91 weight % of the above-mentioned aluminum oxide powder and 9 weight % of silicon carbide powder (average particle diameter 0.2 μm) was molded and sintered, thereby obtaining a support plate (corresponding to a second substrate 23) of a disc shaped aluminum oxide based sintered body with a diameter of 230 mm and a thickness of 5 mm. The sintering conditions were the same as those for the power supply terminal 26 above.

Next, a hole for receiving and securing the power supply terminal was formed in the aluminum oxide based sintered body by drilling using a diamond drill, thereby obtaining a support plate formed from an aluminum oxide based sintered body.

Manufacturing the Mounting Plate

In the same manner as in the above-described manufacturing method for the support plate formed from an aluminum oxide based sintered body, a disc shaped aluminum oxide based sintered body (corresponding to a first substrate 21) with a diameter of 230 mm and a thickness of 5 mm was obtained. Next, one surface (the mounting surface of a plate specimen) of this disc shaped aluminum oxide based sintered body was polished to obtain a flatness of 10 μm, thereby obtaining a mounting plate formed from an aluminum oxide based sintered body, as shown in FIG. 2A.

Joining and Unification

The power supply terminal was pressed and embedded into the hole formed in the support plate as shown in FIG. 2A.

Next, as shown in FIG. 2B, the support plate on which this power supply terminal was embedded and fixed, was coated with a coating material comprising a composite conductive material (50 volume % of molybdenum carbide ($Mo_2C$) powder (average particle diameter 0.5 μm) and 50 volume % of aluminum oxide powder) and terpineol or the like using a screen printing method, so as to form a plasma generation electrode in a subsequent heat treatment process under pressure, and then dried, thereby forming plasma generation electrode forming layer 22'.

Then, the region on the support plate 23 excluding the plasma generation electrode forming region was coated with a coating material comprising aluminum oxide powder 70 weight %, and the remainder screen oil, using a screen printing method, and then dried, thereby forming an insulating material layer 27.

Next, as shown in FIG. 2C, the mounting plate 21 and the support plate 23 were superposed so as to enclose the plasma generation electrode forming layer 22' (printed surface), and the insulating material layer 27, such that the polished surface of the mounting plate was the upper surface, and then heat treated under pressure in an argon (Ar) atmosphere in a hot press to join and unify them. The conditions of the pressure and heat treatment at this time were a temperature of 1850° C., a pressure of 10 MPa, and the heat treatment time was 2 hours.

Afterwards, the temperature was brought to room temperature by radiational cooling, thus obtaining a susceptor with a built-in electrode of example 1.

Example 2

In example 2, a susceptor with a built-in electrode was obtained in the same manner as example 1. However, the amount of molybdenum carbide powder in the coating material forming the plasma generation electrode was changed to 70 volume %, and the amount of aluminum oxide powder to 30 volume %.

Example 3

In example 3, a susceptor with a built-in electrode was obtained in the same manner as example 1. However, the mixed powder forming the power supply terminal was changed to a mixed powder of aluminum oxide powder: 50 volume %, and molybdenum carbide powder: 50 volume %.

Example 4

Green bodies that form a power supply terminal, a support plate, and a mounting plate, after sintering, were manufactured using known technology in the same manner as in example 1. Furthermore, the power supply terminal green body was embedded into a fixing hole formed in the support plate green body.

Next, in the same manner as in example 1, a plasma generation electrode forming layer and an insulating material layer were formed on the support plate green body, and the mounting plate green body and the support plate green body were superposed via the plasma generation electrode forming layer and the insulating material layer and sintered under pressure in a hot press, thereby joining and unifying them at the same time as obtaining a sintered body corresponding to each green body, thus obtaining the susceptor with a built-in electrode according of example 4.

Comparative Example 1

In comparative example 1, a susceptor with a built-in electrode was obtained in the same manner as in example 1. However, the coating material for forming the plasma generation electrode was changed to a coating material comprising tungsten as a conductive element, and the remainder terpineol or the like.

Comparative Example 2

In comparative example 2, a susceptor with a built-in electrode was obtained in the same manner as in example 1. However, the molybdenum carbide powder in the coating material forming the plasma generation electrode was changed to 28 volume %, and the aluminum oxide powder to 72 volume %.

Comparative Example 3

In comparative example 3, a susceptor with a built-in electrode was obtained in the same manner as in example 1. However, the molybdenum carbide powder in the coating material forming the plasma generation electrode was changed to 98 volume %, and the aluminum oxide powder to 2 volume %.

Evaluation

The cross-sections of the joints in the susceptors with built-in electrodes of examples 1 to 4 manufactured in this manner were examined using an SEM, and it was confirmed that the mounting plates and the support plates and the power supply terminals were joined satisfactorily.

Furthermore, each of the susceptors with built-in electrodes of examples 1 to 4 was placed in a mixed gas (1 torr) of $CF_4$ gas and $O_2$ gas, a high frequency current of 13.56 MHz and 10 KW was applied to the plasma generation electrode through the power supply terminal 24 to generate plasma, and after exposure to this plasma for 15 hours, the temperature was brought to room temperature by radiational cooling, the surface characteristics of the susceptor with a built-in electrode were visually inspected, and the change of the surface roughness of the mounting surface of the plate specimen was measured, with no change in the surface characteristics observed, and with practically no change in the surface roughness (Ra=0 before the test, Ra=0.13 $\mu$m after the test). Consequently, it was determined that the corrosion resistance and plasma resistance were very good.

Moreover, when exposure to the plasma (that is, heat cycles stress) was repeated 10000 times, no crack occurred in the vicinity of the connection of the plasma generation electrode and the power supply terminal, so no problem occurred.

However, when the susceptor with a built-in electrode of comparative example 1 was repeatedly exposed to the above plasma (that is, heat cycles stress) 100 times, cracks occurred in the vicinity of the connection of the plasma generation electrode and the power supply terminal, thus damaging it.

When the cross-section of the joint in the susceptor with a built-in electrode of comparative example 2 was examined using an SEM, the mounting plates, the support plates and the power supply terminals were joined satisfactorily. However, when exposure to the plasma (that is, heat cycles stress) was repeated 100 times, cracks occurred in the vicinity of the connection of the plasma generation electrode and the power supply terminal, thus damaging it.

Moreover, when the cross-section of the joint in the susceptor with a built-in electrode of comparative example 3 was examined using an SEM, the mounting plate, the support plate and the plasma generation electrode had become detached, so the mounting plate and the support plate were not joined and unified satisfactorily.

As described above, in a susceptor with a built-in electrode of the present invention, thermal stress caused by the difference in coefficients of thermal expansion between the aluminum oxide based sintered body and the internal electrode is reduced, the repeated rising and falling temperature, in other words heat cycles stress, is withstood, and no cracking occurs, thus improving durability significantly. Furthermore, because no corrosive gas or plasma penetrates the joining face of the first substrate and the second substrate, the joint interface of these substrates cannot be damaged. Moreover, because there is no likelihood of the plasma generation electrode being exposed to corrosive gas or plasma, the corrosion resistance and plasma resistance are excellent.

Furthermore, according to the manufacturing method for a susceptor with a built-in electrode, it is not necessary to use expensive niobium, tantalum or the like, thus enabling a susceptor with a built-in electrode to be manufactured economically.

What is claimed is:

1. A susceptor with a built-in electrode comprising:

a susceptor substrate made of an aluminum oxide based sintered body;

an internal electrode that is built into said susceptor substrate; and a power supply terminal that is provided so as to make contact with said internal electrode;

wherein said internal electrode is formed by an aluminum oxide and molybdenum carbide based composite sintered body containing 30 to 95 volume % of molybdenum carbide, and 5 to 70 volume % of aluminum oxide.

2. A susceptor with a built-in electrode according to claim 1, wherein said susceptor substrate comprises: a first substrate formed by an aluminum oxide based sintered body; and a second substrate formed by an aluminum oxide based sintered body, which is joined and unified with said first substrate.

3. A susceptor with a built-in electrode according to claim 1, wherein an insulating material layer comprising insulating material that has the same composition or the same principal component as the material constituting said first substrate and said second substrate is formed in a region excluding a part where said internal electrode is formed.

4. A susceptor with a built-in electrode according to claim 1, wherein said power supply terminal is formed by any one of an aluminum oxide and molybdenum carbide based composite sintered body, an aluminum oxide and tantalum carbide based composite sintered body, an aluminum oxide and tungsten based composite sintered body, and an aluminum oxide and silicon carbide based composite sintered body.

5. A manufacturing method for a susceptor with a built-in electrode comprising the steps of: forming a hole in a second substrate formed from an aluminum oxide based sintered body, and fixing a power supply terminal into said hole so as to pass through the second substrate;

then, coating said second substrate holding said power supply terminal, with a coating material containing an aluminum oxide and molybdenum carbide based composite material containing 30 to 95 volume % of molybdenum carbide and 5 to 70 volume % of aluminum oxide, so as to make contact with said power supply terminal, drying, superposing said second substrate onto a first substrate formed from an aluminum oxide based sintered body so as to enclose the surface coated with said coating material, and heat treating under pressure, to thereby join and unify them, and also to form an internal electrode comprising an aluminum oxide and molybdenum carbide based composite sintered body between said first substrate and said second substrate.

6. A manufacturing method for a susceptor with a built-in electrode comprising the steps of: forming a first green body and a second green body that serve as a first substrate and a second substrate respectively after sintering; forming a hole in said second green body; fixing a power supply terminal into said hole so as to pass through said second green body; coating said green body holding said power supply terminal, with a coating material containing an aluminum oxide and molybdenum carbide based composite material containing 30 to 95 volume % of molybdenum carbide and 5 to 70 volume % of aluminum oxide, so as to make contact with said power supply terminal, and drying it; then superposing said second green body onto said first green body so as to enclose the surface coated with said coating material; and heat treating under pressure and sintering, thereby forming a first substrate and a second substrate, which are joined and unified, and also forming an internal electrode comprising an aluminum oxide and molybdenum carbide based composite sintered body between said first and second substrates.

7. A manufacturing method for a susceptor with a built-in electrode according to claim 5, wherein an insulating material layer comprising insulating material that has the same composition or the same principal component as the materials constituting said first substrate and said second substrate is formed in a region excluding a part where said internal electrode is formed.

8. A susceptor with a built-in electrode according to claim 2, wherein an insulating material layer comprising insulating material that has the same composition or the same principal component as the material constituting said first substrate and said second substrate is formed in a region excluding a part where said internal electrode is formed.

9. A susceptor with a built-in electrode according to claim 2, wherein said power supply terminal is formed by any one of an aluminum oxide and molybdenum carbide based composite sintered body, an aluminum oxide and tantalum carbide based composite sintered body, an aluminum oxide and tungsten based composite sintered body, and an aluminum oxide and silicon carbide based composite sintered body.

10. A susceptor with a built-in electrode according to claim 3, wherein said power supply terminal is formed by any one of an aluminum oxide and molybdenum carbide based composite sintered body, an aluminum oxide and tantalum carbide based composite sintered body, an aluminum oxide and tungsten based composite sintered body, and an aluminum oxide and silicon carbide based composite sintered body.

11. A susceptor with a built-in electrode according to claim 8, wherein said power supply terminal is formed by any one of an aluminum oxide and molybdenum carbide based composite sintered body, an aluminum oxide and tantalum carbide based composite sintered body, an aluminum oxide and tungsten based composite sintered body, and an aluminum oxide and silicon carbide based composite sintered body.

12. A manufacturing method for a susceptor with a built-in electrode according to claim 6, wherein an insulating material layer comprising insulating material that has the same composition or the same principal component as the materials constituting said first substrate and said second substrate is formed in a region excluding a part where said internal electrode is formed.

* * * * *